US007114135B1

(12) United States Patent
Gauvin

(10) Patent No.: US 7,114,135 B1
(45) Date of Patent: Sep. 26, 2006

(54) ROUTING OF TEST SIGNALS OF INTEGRATED CIRCUITS

(75) Inventor: Coralyn S. Gauvin, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 459 days.

(21) Appl. No.: 10/044,155

(22) Filed: Jan. 11, 2002

(51) Int. Cl.
*G06F 17/50* (2006.01)

(52) U.S. Cl. .............................. 716/4; 716/12; 714/724; 703/14; 703/28

(58) Field of Classification Search .................. 716/4, 716/12; 703/14, 28; 714/724
See application file for complete search history.

(56) References Cited

U.S. PATENT DOCUMENTS 5,473,546 A * 12/1995 Filseth ........................... 716/8
5,657,241 A * 8/1997 Butts et al. ................... 716/16
5,661,662 A * 8/1997 Butts et al. ................... 716/16
6,243,664 B1 * 6/2001 Nazarian et al. .............. 703/14
6,377,912 B1 * 4/2002 Sample et al. ................. 703/28
6,456,961 B1 * 9/2002 Patil et al. ..................... 703/14
2003/0131327 A1 * 7/2003 Dervisoglu et al. ............. 716/4
2005/0044460 A1 * 2/2005 Hoglund et al. .............. 714/724

* cited by examiner

*Primary Examiner*—A. M. Thompson
(74) *Attorney, Agent, or Firm*—Suiter, West, Swantz PC LLO

(57) ABSTRACT

In an integrated circuit, test signals are routed from test points through a hierarchy of distributed multiplexers to output pads. The multiplexers are distributed locally to various regions that are arranged in a hierarchy of regional levels. Thus, each test signal is routed to the locally distributed multiplexer, and only a portion of the test signals reach the top-level multiplexer.

13 Claims, 3 Drawing Sheets

ROUTING OF TEST SIGNALS OF INTEGRATED CIRCUITS

FIELD

The subject matter herein relates to testing of integrated circuit (IC) chips. More specifically, the subject matter herein relates to distributing test circuitry across an IC chip.

BACKGROUND

As integrated circuits (IC's) have become more complex with larger numbers of components (e.g. transistors, capacitors, etc.), techniques for testing and debugging the circuitry on the IC chips have also become more complex. Original testing techniques usually involved applying stimulus signals to the input pins of the IC and monitoring the output results and also reading internal registers of the IC. Due to the complexity of current IC's, however, it is no longer sufficient merely to supply a series of test signals at the input pins of the IC chip under test and see what happens on the output pins and to read the registers. Instead, it has become necessary to tap various internal signals at various internal test points of the IC chip that would otherwise be hidden from the outputs, so that a more detailed view of the internal workings of the many components or sub-circuits of the IC chip may be obtained. The internal signals are, thus, routed to test pads, where the signals can be measured by probes touching the test pads. Ordinarily, several such test pads and probes are used for one IC chip. As the IC chips have become more complex with larger numbers of components, however, it has become impractical to simultaneously probe each test point, since there may be several hundred or thousands of desired test points. There is physically not enough room to apply a test probe to a test pad for each test point or internal signal. Therefore, it has become necessary to multiplex the internal signals together to select only a subset of the internal signals to be sent to a reasonable number of the test pads at one time. The tests are typically repeated with different subsets of the internal signals selected each time in order to sample all of the desired test points and internal signals.

All of the internal signals from all test points 100 are, thus, routed to a multiplexer 102, as shown for an exemplary IC 104 in FIG. 1. Each of the dots in FIG. 1 represents a test point 100 from which signal traces, wires or conductive paths 106 carry the internal signals to the multiplexer 102. The test points 100 are typically arranged in hierarchical levels 108, 110 and 112 that correspond to levels of "functional blocks" or "functional units" of the IC 104. At the lowest level 108 (level 3), the test points 100 typically involve groups 114 of related test points 100, such as for a particular small portion of the overall IC 104. The lowest levels 108 (levels 3), which are typically "component blocks" of the IC 104, may include one or more of the groups 114 of related test points 100. The next level 110 (level 2) may include one or more of the previous levels 108 (levels 3), and so on. At each succeeding level 108, 110 and 112, the signal traces 106 are typically aggregated into ever larger groups, so that by the time the signal traces 106 reach the multiplexer 102, there may be several hundred or thousands of the signal traces 106. Under control of test equipment (not shown), the multiplexer 102 typically selects one of the groups 114 of the signal traces 106 to supply selected internal signals to test pads 116.

With several hundred or thousands of the signal traces 106 to be routed around the IC 104 from the test points 100 to the multiplexer 102, chip layout becomes more costly, difficult and time-consuming. The signal traces 106 take up considerable space on the IC 104, which already contains many components for performing the actual functions of the IC 104. Determining the most efficient, economical and unobtrusive layout for the signal traces 106 to avoid interfering with the spaces for the components of the IC 104 requires significant time and resources.

It is with respect to these and other background considerations that the subject matter herein has evolved.

SUMMARY

The subject matter described herein involves an integrated circuit (IC) having a test circuit layout that minimizes, or economizes, the number of signal traces that are routed around the IC to output test pads for measuring internal signals of the IC. Thus, the space within the IC used by the signal traces is minimized, allowing for ease of laying out the signal traces and resulting in greater efficiency in design and laying out of the IC. In other words, the cost, time and resource allocation for the tasks involved in IC design and layout are improved.

Rather than routing all of the signal traces to a single large multiplexer, as described in the background (with reference to FIG. 1), the signal traces in various regions of the IC are routed to a multiplexer that is local to the region and from which the internal signals on only a selected few signal traces are passed on, either to a multiplexer for a larger region or to the output pads.

The smallest regions involve the lowest level in a hierarchy of levels. Signal traces are routed to a multiplexer within each level. Each multiplexer selects only a portion of the signal traces to be passed on to the next higher level, or larger region. Thus, only a selected subset of the signal traces in each level are passed on to the next higher level, so not all of the signal traces are routed to the last multiplexer in the hierarchy. Instead, each signal trace is relatively short and local, and only a relatively small number of signal traces extend to the last multiplexer in the hierarchy. In this manner, the space in the IC for the signal traces is minimized.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

DETAILED DESCRIPTION

Figure 1:
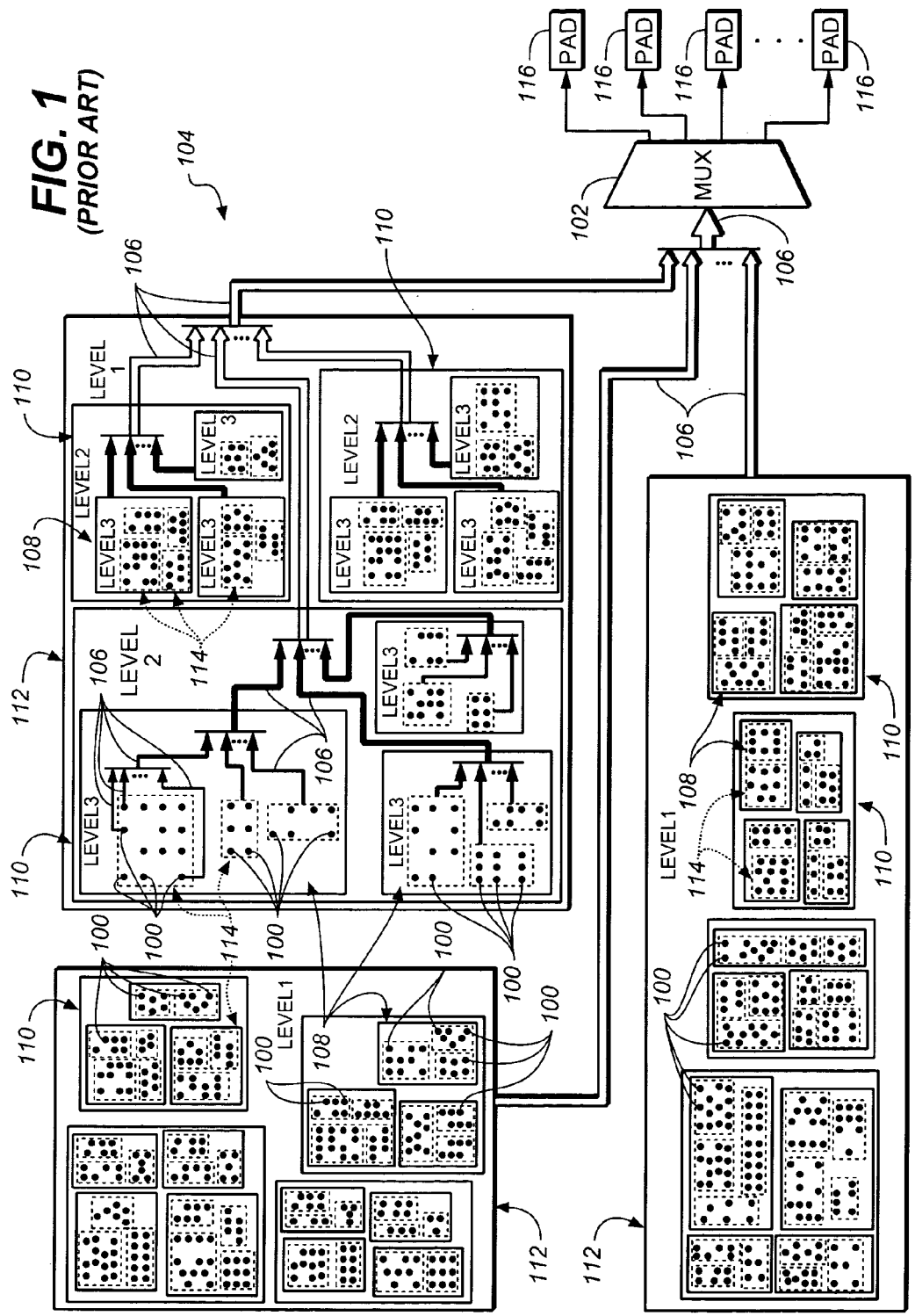
FIG. 1 is a block diagram of an integrated circuit having a prior art test signal routing technique.
Figure 2:
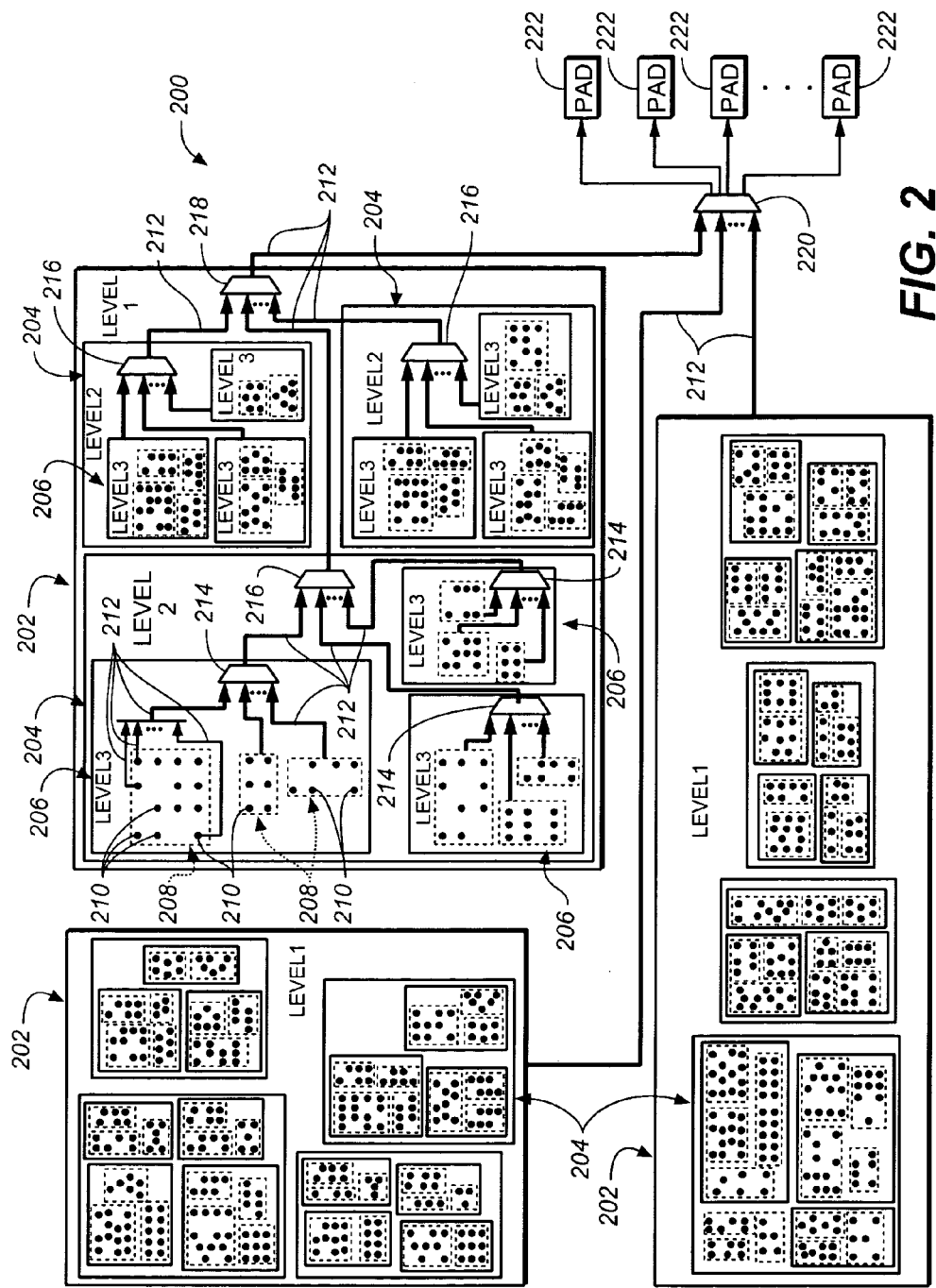
FIG. 2 is a block diagram of an integrated circuit having an improved test signal routing technique.

An integrated circuit (IC) 200, as shown in FIG. 2, generally has several top-level functional units 202 that include smaller lower-level functional units 204, which in turn include even lower-level functional units, or components blocks, 206 and 208. Each functional unit or component block 202–208 performs a function or sub-function of the IC 200. Additionally, components (not shown) that make up the functional units and component blocks 202–208 are generally arranged near each other in the IC 200. Thus, the various levels of functional units and component blocks 202–208 generally correlate to physical regions within the IC 200. The lowest-level component blocks 208 correlate to the smallest regions, with each higher-level function unit 202–206 correlating to larger and larger regions, encompassing the smaller regions.

Several test points 210, from which test signals 212 are generated, are included in each of the lowest-level component blocks 208. Related test points 210 are typically within the same lowest-level component block 208. Additionally, the related test points 210 within each component block 208 are preferably aggregated into at least one group of the test points 210. The groups of the test points 210 are arranged in a hierarchy of levels, generally corresponding to the functional units 202–206, or regions of the IC 200. Although the embodiment shown in FIG. 2 is shown having a certain number of levels, regions or functional units 202–206, it is understood that any number of levels and sub-levels may be used.

Each functional unit 202–206, level or region, has a multiplexer 214, 216 or 218 associated therewith and that is disposed locally thereto. Additionally, the IC 200 includes a top-level multiplexer 220. The test signals 212 from each group of the test points 210 in each component block 208 within each lowest-level functional unit 206 are supplied to the multiplexer 214 that is disposed locally to the lowest-level functional unit 206. Each multiplexer 216 and 218 (i.e. "mid-level" multiplexers) of the higher-level functional units 202 and 204, level or region, receives the outputs from the multiplexers 214 and 216, respectively, of the lower-level functional units 204 and 206. Likewise, the top-level multiplexer 220 receives the outputs from the multiplexers 218 of the highest-level functional units 202.

The multiplexers 214 select the test signals 212 of one of the groups of the test points 210 within the lowest-level functional units 206 and pass the selected test signals 212 to the multiplexers 216 of the next higher-level functional units 204, levels or regions. The multiplexers 216, likewise, select the test signals 212 of one of the multiplexers 214 of the next lower-level functional units 206 and pass the selected test signals 212 to the multiplexers 218 of the next higher-level functional units 202. The multiplexers 218, likewise, select the test signals 212 of one of the multiplexers 216 of the next lower-level functional units 204 and pass the selected test signals 212 to the top-level multiplexer 220. Thus, at each functional unit 202–206, level or region, the multiplexer 214–218 associated therewith selects the test signals 212 of one group of the test points 210 to be passed to the next multiplexer 216–220. In this manner, only a portion of the test signals 212 that originate from all the test points 210 throughout the IC 200 reach the top-level multiplexer 220. The top-level multiplexer 220 makes the final selection of the test signals 212 of one of the multiplexers 218 of the highest-level functional units 202 and passes the final selected portion of the test signals 212 to several output pads, or locations, 222.

Figure 3:
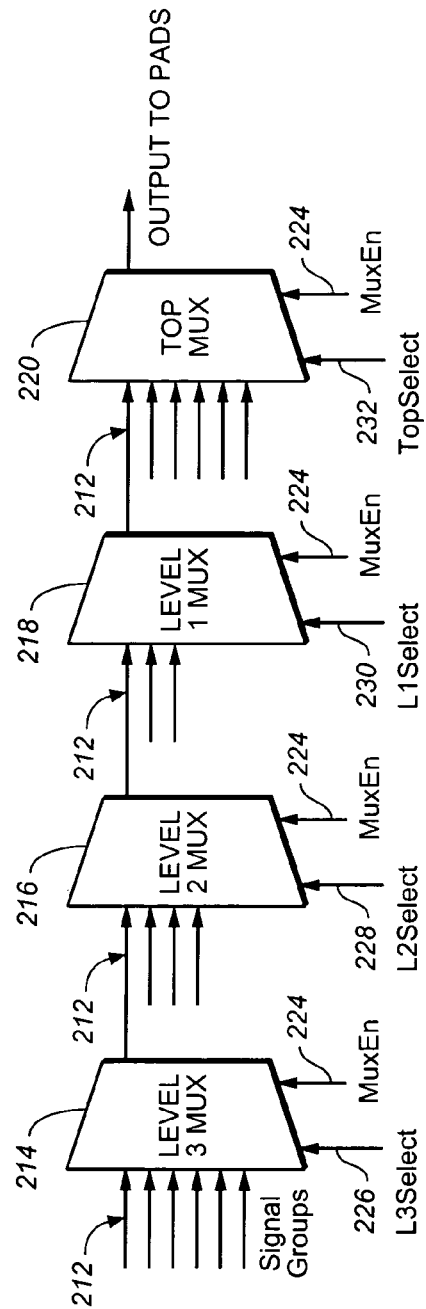
FIG. 3 is a block diagram of a hierarchy of multiplexers used in the test signal routing technique shown in FIG. 2.

Operation of the multiplexers 214–220 is illustrated in FIG. 3 using one multiplexer 214–218 from each of the levels plus the top-level multiplexer 220. Each of the multiplexers 214–218 (see also FIG. 2) operate similarly to the ones shown in FIG. 3. An enable signal (MuxEn) 224 is supplied to each multiplexer 214–220 by control circuitry (not shown) to activate the multiplexers 214–220 when it is desired to measure the test signals 212. Thus, the enable signal (MuxEn) 224 is preferably asserted only during testing of a test version of the IC 200 (FIG. 2) and not during operation of a production version of the IC 200, if the multiplexers 214–220 remain in the IC 200 after development ends. Although it is possible to remove the test signals 212 and the multiplexers 214–220 after development has been completed, it is likely that the test signals 212 and the multiplexers 214–220 will remain in the production version of the IC 200, but will be unused, or inactive.

Select signals (L3Select) 226, (L2Select) 228, (L1 Select) 230 and (TopSelect) 232 are supplied by the control circuitry (not shown) to the multiplexers 214, 216, 218 and 220, respectively, in each level. The select signals 226–232 cause the multiplexers 214–220 to select one group of the test signals 212 supplied thereto to be passed to the next higher-level multiplexer 216–220 or to the output pads 222 (FIG. 2). To minimize the number of select signals 226–230 needed to select the desired group of test signals 212, the same select signal (L3Select) 226, (L2Select) 228 or (L1 Select) 230 at each level may be supplied to each multiplexer 214, 216 or 218, respectively, in the level. As with the enable signal (MuxEn) 224, the select signals 226–232 are preferably asserted only during testing of a test version of the IC 200 (FIG. 2) and not during operation of a production version of the IC 200, if the multiplexers 214–220 remain in the IC 200 after development ends.

The technique of routing test signals uses a distributed hierarchy of multiplexers to achieve the advantage of requiring fewer test signals that have to be routed to the multiplexer that outputs the selected test signals to the output pads than does the prior art. Thus, the space within the IC reserved for the test signals is relatively small, whereas the number of test points is relatively large. In this manner, a very thorough testing of the IC is possible with a relatively unobtrusive test circuitry.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A method of routing test signals from test points of an integrated circuit (IC) to output locations comprising:
   designating a plurality of the test points in the IC, from which the test signals are generated;
   designating a hierarchy of a plurality of regional levels and sub-levels within the IC, each regional level and sub-level including a portion of the test points; distributing a hierarchy of a plurality of multiplexers across the IC, each multiplexer being local to one of the regional levels and sub-levels;
   connecting a lowest-level portion of the multiplexers to the test points to receive the test signals therefrom;
   connecting a mid-level portion of the multiplexers to other multiplexers to receive selected portions of the test signals therefrom; and
   connecting a highest-level one of the multiplexers to output locations to supply a final one of the selected portions of the test signals thereto.

2. A method as defined in claim 1 wherein the test points are internal to circuitry of the IC.

3. A method as defined in claim 1 wherein the final one of the selected portions of the test signals are measurable at the output locations.

4. A method of routing test signals from test points of an integrated circuit (IC) through a plurality of multiplexers to output locations comprising:
- arranging the test signals into a plurality of groups;
- arranging the groups into a hierarchy of regional levels, including a highest regional level and at least one lower regional level, each regional level corresponding to a region of the IC;
- providing a multiplexer for each regional level locally to the region corresponding to the regional level;
- selecting one group of test signals at each lower regional level to be passed through the multiplexer thereof to a next higher regional level; and
- selecting one group of test signals at the highest regional level to be passed through the multiplexer thereof to output locations.

5. A method as defined in claim 4 further comprising:
connecting only a portion of the groups of test signals to the multiplexer of the highest regional level.

6. A method as defined in claim 4 wherein the test points are internal to circuitry of the IC.

7. A method as defined in claim 4 wherein the group of test signals selected by the highest regional level is measured at the output locations.

8. An integrated circuit (IC) comprising:
- a plurality of test points from which test signals are generated; a plurality of output locations at which a portion of the test signals are measured;
- a plurality of groups of the test signals;
- a plurality of regions within which the test signals are generated and the groups of the test signals are arranged;
- a plurality of hierarchical regional levels within which the regions are arranged; and
- a plurality of multiplexers, each disposed locally to one of the regional levels, at least a portion of the multiplexers connected to receive the groups of the test signals from the test points and at least one of the multiplexers connected to receive at least a portion of the groups of the test signals from another one or more of the multiplexers, each multiplexer selecting one of the groups of the test signals within the regional level to which the multiplexer is locally disposed and passing the selected group of test signals to a next higher regional level or to output locations.

9. An IC as defined in claim 8 further comprising:
internal functional circuitry; and wherein the test points are located within the internal functional circuitry of the IC.

10. An integrated circuit (IC) comprising:
- a plurality of means for generating test signals indicating functioning of the IC;
- a plurality of means for outputting selected ones of the test signals;
- a plurality of regions relating to functions of the IC;
- a plurality of groups of the test signals, the groups being arranged within the regions;
- a plurality of hierarchical regional levels within which the regions are arranged; and
- a plurality of selecting means, each local to one of the regional levels and each for selecting one group of test signals within the regional level to which the selecting means is local to be passed to the selecting means of a next higher regional level or to the outputting means, at least a portion of the selecting means being connected to the generating means and at least one of the selecting means being connected to the outputting means.

11. An IC as defined in claim 10 wherein each selecting means includes a multiplexer.

12. An IC as defined in claim 10 further comprising: internal functional circuitry; and wherein the test signal generating means are located within the internal functional circuitry of the IC.

13. An IC as defined in claim 10 wherein selected ones of the test signals are measured at the outputting means.

* * * * *